United States Patent
Yang et al.

(10) Patent No.: US 9,825,101 B2
(45) Date of Patent: Nov. 21, 2017

(54) TOP-EMITTING OLED SUBSTRATE AND FABRICATION METHOD THEREOF, AND DISPLAY APPARATUS

(71) Applicants: BOE TECHNOLOGY GROUP CO., LTD, Beijing (CN); Chengdu BOE Optoelectronics Technology Co., Ltd., Chengdu (CN)

(72) Inventors: Wenbin Yang, Beijing (CN); Qing Chang, Beijing (CN); Jinhao Huang, Beijing (CN); Xiangnan Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 15/038,323

(22) PCT Filed: Dec. 10, 2015

(86) PCT No.: PCT/CN2015/097028
§ 371 (c)(1),
(2) Date: May 20, 2016

(87) PCT Pub. No.: WO2016/127700
PCT Pub. Date: Aug. 18, 2016

(65) Prior Publication Data
US 2016/0365388 A1  Dec. 15, 2016

(30) Foreign Application Priority Data
Feb. 13, 2015  (CN) .......................... 2015 1 0080227

(51) Int. Cl.
*H01L 27/32* (2006.01)
*H01L 51/52* (2006.01)
*H01L 51/56* (2006.01)

(52) U.S. Cl.
CPC ...... *H01L 27/3206* (2013.01); *H01L 27/3211* (2013.01); *H01L 51/5203* (2013.01);
(Continued)

(58) Field of Classification Search
CPC . H01L 27/3206; H01L 51/56; H01L 51/5221; H01L 51/5253; H01L 51/5259;
(Continued)

(56) References Cited

U.S. PATENT DOCUMENTS

| 2009/0135468 | A1 | 5/2009 | Park | |
| 2012/0299045 | A1* | 11/2012 | Pan | ...................... H01L 51/5032 257/98 |
| 2016/0204361 | A1* | 7/2016 | Mizuki | ................ C07D 403/14 257/40 |

FOREIGN PATENT DOCUMENTS

| CN | 101446728 A | | 6/2009 | |
| CN | 104659068 A | | 5/2015 | |
| KR | 20100030980 A | * | 3/2010 | ......... H01L 51/0096 |

OTHER PUBLICATIONS

State Intellectual Property Office of the P.R.C (SIPO) Office Action 1 for 201510080227.6 dated Feb. 24, 2017 9 Pages.

* cited by examiner

*Primary Examiner* — Adam S Bowen
(74) *Attorney, Agent, or Firm* — Anova Law Group, PLLC

(57) ABSTRACT

An organic light-emitting diode substrate is provided. The organic light-emitting diode substrate comprises a substrate; a conductive layer formed over the substrate comprising a plurality of anodes and a plurality of cathodes, wherein each
(Continued)

of the anodes are electrically insulated from the rest of the anodes and the cathodes; and a light-emitting layer formed over the plurality of anodes and the plurality of cathodes and being electrically connected with the plurality of anodes and the plurality of cathodes.

20 Claims, 6 Drawing Sheets

(52) U.S. Cl.
CPC ...... *H01L 51/5218* (2013.01); *H01L 51/5221* (2013.01); *H01L 51/5253* (2013.01); *H01L 51/5259* (2013.01); *H01L 51/56* (2013.01)

(58) Field of Classification Search
CPC ............. H01L 51/5218; H01L 51/5203; H01L 27/3211
USPC .......................................................... 257/40
See application file for complete search history.

TOP-EMITTING OLED SUBSTRATE AND FABRICATION METHOD THEREOF, AND DISPLAY APPARATUS

CROSS-REFERENCES TO RELATED APPLICATIONS

This application is a national phase entry under 35 U.S.C. §371 of International Application No. PCT/CN2015/097028, filed on Dec. 10, 2015, which claims priority to Chinese Patent Application No. 201510080227.6, filed on Feb. 13, 2015. The above enumerated patent applications are incorporated by reference herein in their entirety.

FIELD OF THE INVENTION

The present invention generally relates to the field of display technologies and, more particularly, to top-emitting OLED substrates and fabrication processes thereof, and a display apparatus.

BACKGROUND

Organic light emitting diode (OLED) display apparatus has many advantages, such as low power-consumption, high color saturation, wide viewing angle, ultra-thin structure, and flexible displaying ability, etc. Thus, it has become a mainstream technology in the display field.

FIG. 1a illustrates a general structure of an OLED. As shown in FIG. 1a, the OLED includes a substrate 001, an anode 002, a light-emitting layer 003, and a cathode 004 sequentially formed on the substrate 001. When a voltage is applied between the anode 002 and the cathode 004 to generate a current, the electrons in the cathode 004 and the holes in the anode 002 may combine within the light-emitting layer 003 to form excitons. The excitons activates the organic material in the light-emitting layer 003 to emit light.

Further, as shown in FIG. 1b, the OLED also includes a hole injection layer 005; a hole transport layer 006, and an electron barrier layer 007 formed between the anode layer 002 and the light-emitting layer 003. Further, the OLED also includes an electron barrier layer 008, an electron transport layer 009 and an electron injection layer 110 formed between the light-emitting layer 003 and the cathode 004.

Thus, as shown in FIG. 1a and FIG. 1b, the OLED includes a plurality of layer structures. Light emitting from the light-emitting layer 003 is scattered and absorbed repeatedly during the light transport process in the plurality of layer structures. The light energy can be significantly loss due to a light wave-guide effect during the light transport process. Thus, there may be only a small amount of light emits from the OLED; and the luminous efficiency may be relatively low. Therefore, the external quantum efficiency of the OLED may be relatively low.

According to the light-emitting mode, OLEDs may be categorized to top-emitting OLEDs and bottom-emitting OLEDs. The bottom-emitting OLED emits light from the substrate side; and the top-emitting OLED emits light from the top side. The cathode of the top-emitting OLED is often made of metal material; it may block a certain amount of light; and it may reflect light. Thus, the cathode of the top-emitting OLED may have to be relatively thin. If not, the external quantum efficiency of the top-emitting OLED may be substantially low; and the image quality and the display effect may be significantly impaired.

Therefore, how to improve the external quantum efficiency of OLED devices; and to reduce the luminous efficiency loss caused by the light wave-guide effect has become a demanding issue in the field of the display technologies.

The disclosed methods and systems are directed to at least partially alleviate one or more problems set forth above and other problems.

BRIEF SUMMARY OF THE DISCLOSURE

On aspect of the present disclosure includes providing an organic light-emitting diode substrate. The organic light-emitting diode substrate is able to reduce the luminous efficiency loss caused by a light wave-guide effect; and improve the external quantum efficiency of the display substrate. The organic light-emitting diode substrate comprises a substrate; a conductive layer formed over the substrate comprising a plurality of anodes and a plurality of cathodes, wherein each of the anodes are electrically insulated from the rest of the anodes and the cathodes; and a light-emitting layer formed over the plurality of anodes and the plurality of cathodes and being electrically connected with the plurality of anodes and the plurality of cathodes.

Optionally, the organic light-emitting diode substrate further includes insulation layers formed between the anodes and adjacent cathodes for electrically insulating the anodes and the adjacent cathodes.

Optionally, the light-emitting layer further includes a plurality of light-emitting regions emitting different colors of light; and each of the light-emitting regions is connected with at least one anode and at least a portion of a cathode.

Optionally, the anodes has a sandwich structure in an order of ITO, Ag and ITO; ITO is substitutable with a material having a high work function; and Ag is substitutable with a material having a high reflectivity and a low resistivity.

Optionally, the cathodes are made of a reflective material including one of an alloy having Mg and Ag, Li, K, an alloy having Ca and Ag, and Al.

Optionally, the organic light-emitting diode substrate further includes a hole injection layer formed on each of the anodes and a hole transport layer formed on the hole injection layer between the anodes and the light-emitting layer.

Optionally, the organic light-emitting diode substrate further includes an electron barrier layer between the hole transport layer and the light-emitting layer.

Optionally, the organic light-emitting diode substrate further includes an electron injection layer formed on each of the cathodes and an electron transport layer formed on the electron injection layer between the cathodes and the light-emitting layer.

Optionally, the organic light-emitting diode substrate further includes a hole barrier layer between the electron transport layer and the light-emitting layer.

Optionally, the organic light-emitting diode substrate further includes a protective layer over the light-emitting layer.

Another aspect of the present disclosure includes providing a display panel. The display panel comprises the disclosed to-emitting organic light-emitting diode substrate.

Another aspect of the present disclosure includes providing a method for fabricating an organic light-emitting diode substrate. The method comprises providing a substrate; forming a conductive layer over the substrate comprising a plurality of anodes and a plurality of cathodes, wherein each of the anodes are electrically insulated from the rest of the anodes and the cathodes; and forming a light-emitting layer over the plurality of anodes and the plurality of cathodes and being electrically connected with the plurality of anodes and the plurality of cathodes.

Optionally, the method further includes forming the plurality of anodes on the substrate; forming a plurality of insulation layers for electrically insulating the plurality of cathodes and the plurality of anodes on the substrate; and forming the plurality of the cathodes on the substrate.

Optionally, the insulation layers are made of one of a black matrix material and polystyrene.

Optionally, forming a plurality of anodes and a plurality of cathodes on the substrate further includes forming the plurality of cathodes on the substrate; forming a plurality of insulation layers for electrically insulating the plurality of cathodes and the plurality of anodes on the substrate; and forming the plurality of anodes on the substrate.

Optionally, the method further includes forming a hole injection layer and a hole transport layer over each of the anodes; and forming an electron injection layer and an electron transport layer over each of the cathodes after forming the plurality of anodes and the plurality of cathodes on the substrate.

Optionally, the hole injection layers, the hole transport layers, the electron injection layers and the electrode transport layers are formed by a thermal evaporation process with a fine metal mask.

Optionally, an electron barrier layer is formed between the hole transport layer and the light-emitting layer; and a hole barrier layer is formed between the electron transport layer and the light-emitting layer.

Optionally, the method further includes forming a protective layer over the light-emitting layer after forming the light-emitting layer.

Optionally, the anodes and the cathodes are made of reflective conductive material.

Optionally, the anodes have a sandwich structure with an order of ITO, Ag, and ITO; and the cathodes are made of a reflective material including one of an alloy having Mg and Ag, Li, K, an alloy having Ca and Ag, and Al.

Optionally, the cathodes are formed by one of a thermal evaporation process and a sputtering process.

Another aspect of the present disclosure includes providing a display apparatus. The display apparatus comprises at least one disclosed organic light-emitting diode substrate.

According to the present disclosure, because the anodes and cathodes of the top-emitting organic light-emitting diode substrate may be formed under the light-emitting layer, the layer numbers that the emitted light transports through may be reduced. The luminous efficiency loss caused by the light wave-guide effect may be reduced; and the external quantum efficiency may be improved. Further, the blockage of the cathode to the emitted light may be reduced. Thus, the thickness limitation of the cathodes may be avoided. At the same time, because the reflection of the anodes and the cathodes, the reflective ability of display substrate may be improved. Thus, the image quality and the display effect may be further enhanced.

Other aspects of the present disclosure can be understood by those skilled in the art in light of the description, the claims, and the drawings of the present disclosure.

BRIEF DESCRIPTION OF THE DRAWINGS

FIG. 2a-1 illustrates an exemplary top view of the structure illustrated in FIG. 2a according to the disclosed embodiments;

FIG. 2a-2 illustrates another exemplary top view of the structure illustrated in FIG. 2a according to the disclosed embodiments;

FIG. 2b-1 illustrates an exemplary top view of the structure illustrated in FIG. 2b according to the disclosed embodiments;

FIG. 2b-2 illustrates another exemplary top view of the structure illustrated in FIG. 2b according to the disclosed embodiments;

DETAILED DESCRIPTION

Reference will now be made in detail to exemplary embodiments of the invention, which are illustrated in the accompanying drawings. The detailed descriptions only illustrate certain exemplary embodiments of the present invention, and are not intended to limit the scope of the present invention.

According to the disclosed embodiments, a top-emitting organic light emitting diode (OLED) substrate is provided.

Figure 1A:
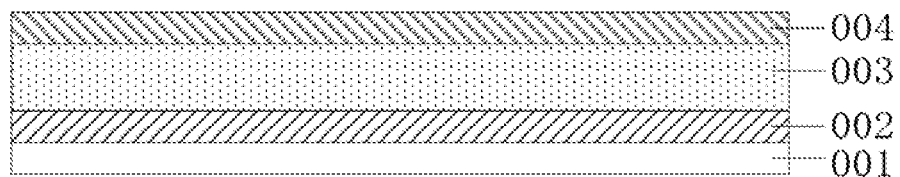
FIG. 1a and FIG. 1b illustrate existing top-emitting organic light emitting diode substrate.
Figure 1B:
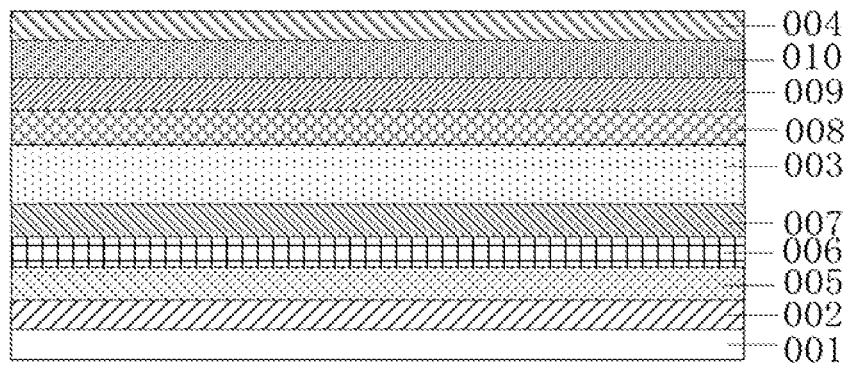
Figure 2A:
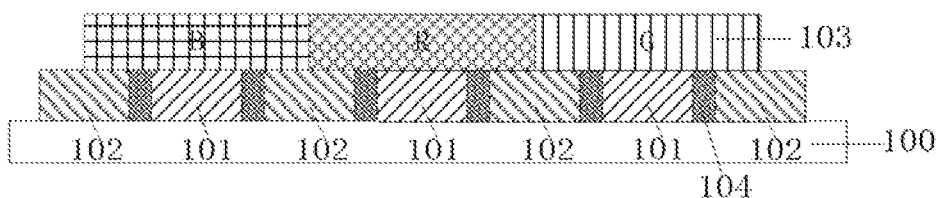
FIGS. 2a~2d illustrate an exemplary organic light emitting diode substrate according to the disclosed embodiments.

FIG. 2a illustrates an exemplary OLED substrate. As shown in FIG. 2a, the OLED substrate may include a substrate 100. Further, the OLED substrate may also include a plurality of anodes 101 and a plurality of cathodes 102 formed in a same layer over the substrate 100. The plurality of anodes 101 and the plurality of cathodes 102 may be electrically insulated. Further, the OLED substrate may also include a light-emitting layer 103. The light-emitting layer 103 may be electrically connected with the plurality of anodes 101 and the plurality of cathodes 102.

In order to avoid the lack of carrier input when a voltage is applied between the anodes 101 and the cathodes 102, it may need to electrically insulate the anodes 101 and adjacent cathodes 102. Thus, as shown in FIG. 2a, an insulation layer 104 may be formed between each of the anodes 101 and an adjacent cathode 102. The insulation layers 104 may prevent the current conduction between the anodes 101 and the adjacent cathodes 102; and the carriers may be able to flow into the light-emitting layer 103.

Further, referring to FIG. 2a, the distribution of the anodes 101 and the cathodes 102 in the same layer may be arranged in any appropriate sequence, such as cathode, anode, cathode, anode, cathode, etc. The anodes 101 and the cathodes 102 may also be distributed as cathode, anode, anode, cathode, etc., as long as the anodes 101 and the cathodes 102 may function as electrodes of the OLED display apparatus.

Further, the light-emitting layer 103 may include a plurality of light-emitting regions, including red light-emitting regions (R), green light-emitting regions (G), and blue light-emitting regions (B), etc. Adjacent light-emitting regions may share an electrode; and the shared electrodes may have a same polarity. For example, two adjacent light-emitting regions may be connected with one of the plurality of anodes 101 or the plurality of cathode 102.

Specifically, the red light-emitting region (R) and the green light-emitting region (G), the red light-emitting region (R) and the blue light-emitting region (B), and the green light-emitting region (G) and the blue light-emitting region (B) may all share electrodes with a same polarity. Referring to FIG. 2a, the two adjacent light-emitting regions share a same cathode 102. That is, the red light-emitting region (R) and adjacent the green light-emitting region (G) are connected with a same cathode 102; and the blue-light emitting region (G) and the adjacent red light-emitting region (R) may be connected with another cathode 102. In another word, under each of the light-emitting regions, there may be one complete anode 101 and two partial cathodes 102.

Figures 1, 2A:
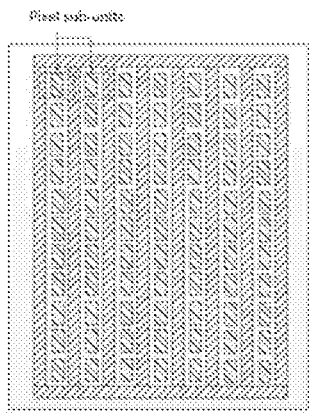

FIG. 2a-1 illustrates an exemplary top view of the structure illustrated in FIG. 2a according to the disclosed embodiments. Such a structure may be formed by a dot-evaporation process. The pixels may be distributed individually, thus it may not cause the entire stripe of cathodes to emit light. Thus, it may not require to form black light-blocking insulation material on the cathodes.

Figures 2, 2A:
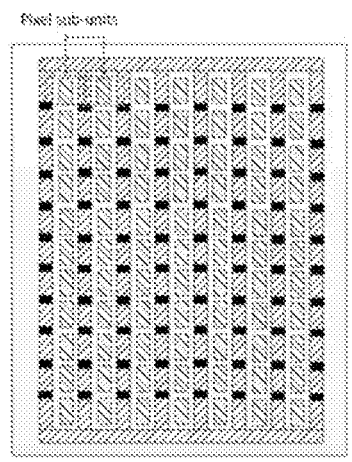

FIG. 2a-2 illustrates another exemplary top view of the structure illustrates in FIG. 2a according to the disclosed embodiments. Such a structure may be formed by a slit-evaporation process. The distribution of the evaporated slits may be identical to the distribution of the cathodes during the slit-evaporation process. Thus, it may require to form black light-blocking insulation material (not labeled) to black matter to black the insulation material on the cathodes. The black light-blocking insulation material (not labeled) may prevent the entire stripe of cathodes to emit light. If the entire stripe of cathodes emit light, it may not able to discriminate different pixels. The black light-blocking insulation material may be selected according to the specific light-emitting characteristic. If the light emission is not affected, the black light-blacking insulation material may be omitted.

Figure 2B:
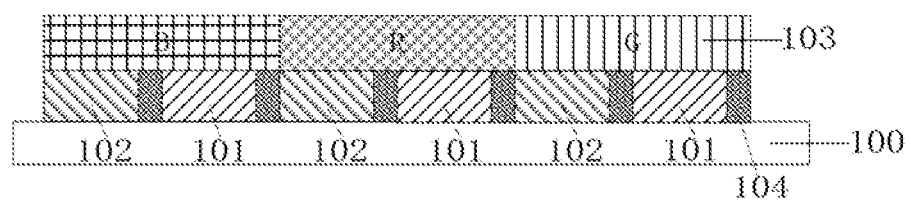
Figures 1, 2B:
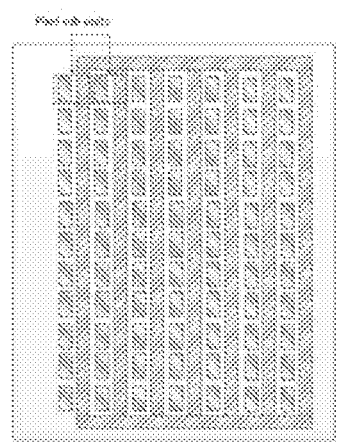
Figures 2, 2B:
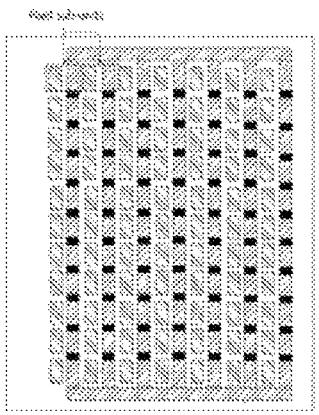

In certain other embodiments, as shown in FIG. 2b, the adjacent light-emitting regions may not share an anode 101 or a cathode 102; and each of the light-emitting regions may be connected with a complete cathode 102. That is, under each of light-emitting regions, there may be a complete anode 101 and a complete cathode 102.

FIG. 2b-1 illustrates an exemplary top view of the structure illustrated in FIG. 2b according to the disclosed embodiments. Such a structure may be formed by a dot-evaporation process. The pixels may be distributed individually, thus it may not cause the entire stripe of cathodes to emit light. Thus, it may not require to form black light-blocking insulation material on the cathodes.

FIG. 2a-2 illustrates another exemplary top view of the structure illustrates in FIG. 2a according to the disclosed embodiments. Such a structure may be formed by a slit-evaporation process. The distribution of the evaporated slits may be identical to the distribution of the cathodes during the slit-evaporation process. Thus, it may require to form black light-blocking insulation material (not labeled) to black matter to black the insulation material on the cathodes. The black light blocking insulation material (not labeled) may prevent the entire stripe of cathodes to emit light. If the entire stripe of cathodes emit light, it may not able to discriminate different pixels. The black light-blocking insulation material may be selected according to the specific light-emitting characteristic. If the light emission is not affected, the black light-blacking insulation material may be omitted.

Further, referring to FIG. 2a and FIG. 2b, the drive method the OLED substrate may be similar as the existing drive method, i.e., the anode-drive method. That is, the OLED substrate may be driven by the existing PMOS-drive method. The connection of the cathodes may be similar as the existing connection methods. That is, the surrounding line may be connected with the interconnect lines of the cathodes.

Comparing with the connection method between the cathodes 102 and the light-emitting layer 103 of the structure illustrated in FIG. 2b, the connection method of the structure illustrated FIG. 2a may increase the area of the carrier flow region of the OLED substrate. Thus, the luminous efficiency of the OLED display device may be increased.

In certain other embodiments, the light-emitting regions and the cathodes 102 may be connected by other appropriate methods. For example, each of the light-emitting regions may be connected with two or more anodes 101 and two or more cathodes 102.

According to the disclosed embodiments, the anodes and the cathodes of the top-emitting OLED substrate may be formed under the light-emitting layer, the layer number that the light emitted from the light-emitting layer transports through may be reduced. Thus, the luminous efficiency loss caused by the light wave-guide effect may be reduced; and the external quantum efficiency of the OLED display device may be enhanced.

Further, because the cathodes are formed under the light-emitting layer, the blockage of the cathodes to the light emitting from the top side of the OLED substrate, i.e., the light-emitting layer side, may be avoided. Thus, the requirement that the cathodes have to be relatively thin may be eliminated. At the same time, by using the reflective ability of the anodes and the cathodes, made of metal, the light emitting to the substrate may be reflected back to the light-emitting layer and the top side of the OLED substrate. Thus, the ability of the light being reflected back to the light-emitting layer may be improved; and the image quality and the display effect may be further enhanced.

Figure 2C:
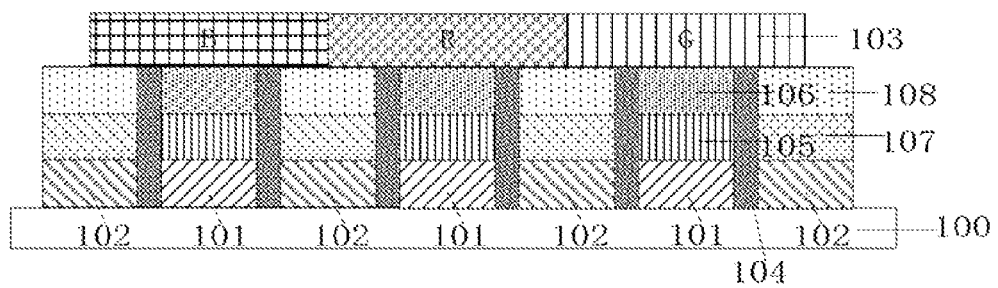

To effectively increase the light-emitting efficiency, as shown in FIG. 2c, the top-emitting OLED substrate may also include a hole injection layer (HIL) 105 and a hole transport layer (HTL) 106 sequentially formed between each of the anodes 101 and the light-emitting layer 103; and/or an electron injection layer (EIL) 108 and an electron transport (ETL) layer 109 sequentially formed between each of the cathodes 102 and the light-emitting layer 103.

The anodes 101, the hole injection layers 105, the hole transport layers 106 the cathodes 102, the electron injection layers 107, and the electron transport layers 108 may be made of different materials. The thickness of each layer may be different, or may be the same. The total thickness of the anodes 101, the hole injection layers 105, and the hole transport layers 106 and the total thickness of the cathodes 102, the electron injection layers 107, and the electron transport layers 108 may be the same, or may be different.

Figure 2D:
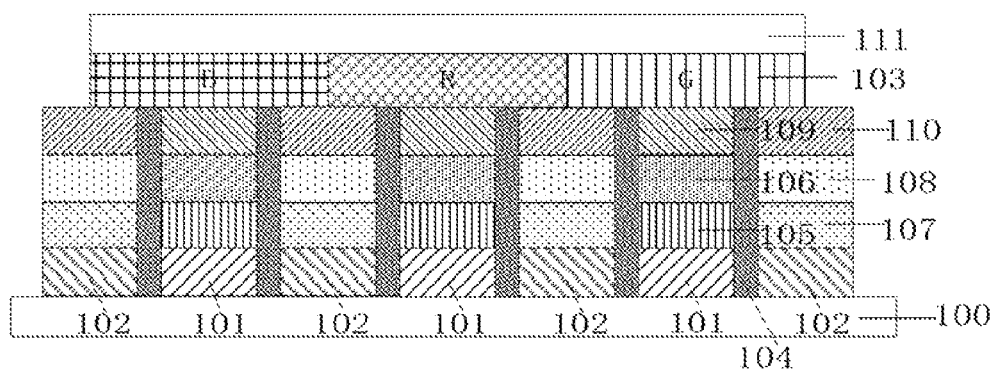

To further increase the light-emitting efficiency, as shown in FIG. 2d, the top-emitting OLED substrate may also include an electron barrier layer 109 formed between each of the hole transport layers 106 and the light-emitting layer 103; and/or a hole barrier layer 110 may be formed between each of the electron transport layers 107 and the light-emitting layer 103. That is, one or both of the electron barrier layers 109 and the hole barrier layers 110 may be formed in the top-emitting OLED substrate.

The electron barrier layers 109 and the hole barrier layers 110 may be made of different materials. The thickness of the electron barrier layers 109 and the thickness of the hole barrier layers 110 may be same, or may be different.

Further, to prevent oxygen and water moisture from entering into the top-emitting OLED substrate to cause the OLED substrate to degrade and/or fail, as shown in FIG. 2d, the top-emitting OLED substrate may also include a protective layer 111 formed over the light-emitting layer 103. The protective layer 111 may be made of any appropriate material. The protective layer 111 may prevent the oxygen and/or moisture in surrounding environment from contacting with the sensitive material of the light-emitting layer 103. Thus, the protective layer 111 may protect the entire top-emitting OLED substrate from erosion and oxidation.

In operation, electrons from the cathodes 101 may transport through the electron injection layer 105 and the electron transport layers 106; and reach to the light-emitting layer 103. Holes from the anodes 102 may transport through the hole injection layer 107s and the hole transport layers 108; and reaches the light-emitting layer 103. The holes and the electrons may combine in the light-emitting layer 103 to form excitons. The exactions may release energy to activate the light-emitting layer 103. Thus, the light-emitting layer 103 may emit light.

Figure 3:
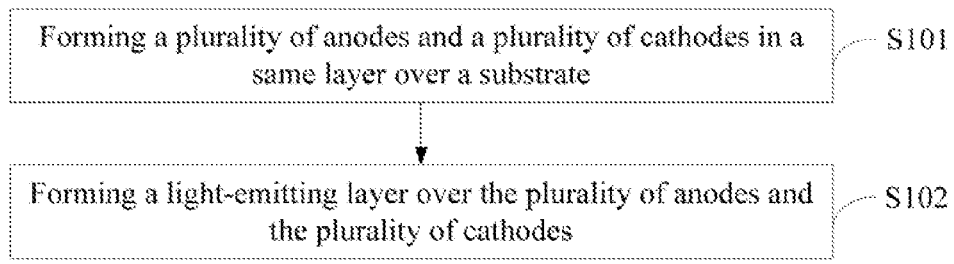
FIG. 3 illustrates an exemplary fabrication process of an organic light emitting diode substrate according to the disclosed embodiments.

Further, according to the disclosed embodiments, a method for forming a top-emitting OLED substrate is provided. FIG. 3 illustrates an exemplary fabrication process of a top-emitting OLED substrate; and FIGS. 4a~4f illustrate structures corresponding to certain stages of the exemplary fabrication process.

Figure 4A:
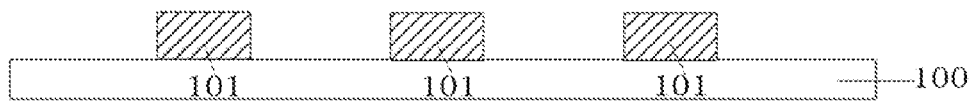
FIGS. 4a~4f illustrate detailed structures corresponding to certain stages of an exemplary fabrication process of an organic light emitting diode substrate according to the disclosed embodiments.
Figure 4B:
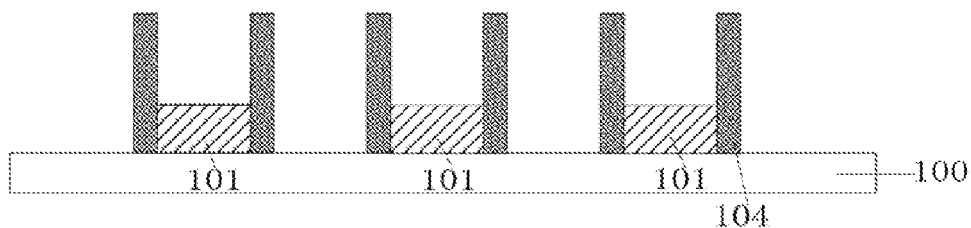
Figure 4C:
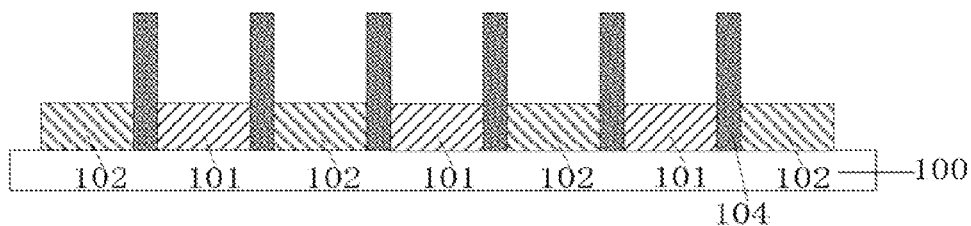

As shown in FIG. 3, at the beginning of the fabrication process, a substrate is provided; and a plurality of anodes and a plurality of cathodes may be formed (S101). FIGS. 4a~4c illustrate corresponding structures.

Specifically, as shown in FIG. 4a, a plurality of anodes 101 are formed on a substrate 100. The substrate 100 may be a glass substrate, or a flexible substrate etc. The substrate 100 provides a base for subsequent devices and structures.

The anodes 101 may be made of any appropriate material. For example, the anodes 101 may have a sandwich structure with an order of ITO, Ag and ITO. Ag may be used to reflect light emitted from the subsequently formed light-emitting layer. In certain other embodiments, ITO in the ITO/Ag/ITO structure may be substituted by one or more of IZO, GITO, and GIZO, etc. Further, in the ITO/Ag/ITO structure, ITO may be substituted by a material having a relatively high work function, such as metal, etc. Ag may be substituted by a material having a high reflectivity and low resistivity. Thus, when the sandwich structure is formed, layer-separation and other interface phenomena may not happen.

Various processes may be used to form the anodes 101, such as a sputtering process, or a thermal evaporation process, etc. A standard photolithography procedure, or a lift-off process using a fine metal mask, etc., may be used to pattern the anodes 101.

Further, as shown in FIG. 4b, after forming the plurality of anodes 101, insulation layers 104 may be formed on the substrate 100 having the anodes 101. The insulation layers 104 may also be formed on the side surfaces of the anodes 101. The insulation layer may be used to electrically insulate the anodes and the subsequently formed cathodes. The thickness of the insulation layers 104 along the direction perpendicular to the substrate 100 may be greater than the thickness of the anodes 101. That is, two adjacent insulation layers 104 may form a trench. The insulation layers 104 may be made of any appropriate material, such as black matrix material, or polystyrene (PS), etc., and may be formed by any appropriate processes.

Further, as shown in FIG. 4c, after forming the insulation layers 104, a plurality of cathodes 102 may be formed on the substrate 100 having the anodes 101 and the insulation layers 104. The cathodes 102 may be made of any appropriate material, such as an alloy having Mg and Ag, etc. Ag may be able to reflect light emitted from the subsequently formed light-emitting layer; to adjust work function the cathodes; and stabilize Mg. The cathodes 102 may also be made of Li, K, Ca/Ag alloy, or Al, etc.

Various processes may be used to form the cathodes 102, such as a thermal evaporation process, or a sputtering process, etc. A mixture of Ag and Mg may be used as the source material of the thermal evaporation process, or a target of the sputtering process. The thickness of the cathodes 102 may be any appropriate value; and may be designed according to the power consumption requirements of the OLED substrate.

Referring to FIG. 4c, the plurality of anodes 101 and the plurality of cathodes 102 may be formed in a same layer on the substrate 100. One anode 101 and one adjacent cathode 102 may be insulated by one insulation layer 104. Further, two adjacent insulation layers 104 may form a trench on one anode 101 or one cathode 102.

In certain other embodiments, the plurality of cathodes 102 may be formed on the substrate 100 firstly; and then the plurality of anodes 101 may be formed after forming the plurality of the insulation layers 104. Thus, the structure illustrated in FIG. 4c may be formed.

In still certain other embodiments, the anodes 101 and the cathodes 102 may be the top electrodes or the bottom electrodes of CMOS devices, PMOS devices and NMOS devices formed in a substrate. The anodes 101 and the cathodes 102 may also be the extension structures of the top electrodes or bottom electrodes of CMOS devices, PMOS devices and NMOS devices formed in a substrate. The CMOS devices, PMOS devices and NMOS devices may be made of poly silicon, or micro-crystalline silicon. The CMOS devices, PMOS devices and NMOS devices may also be OLED thin film transistors, etc.

Figure 4D:
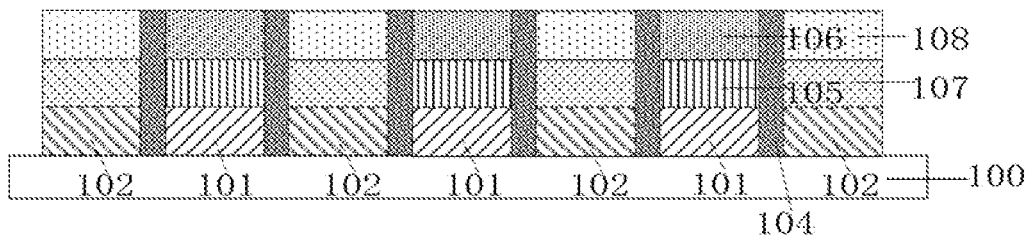

Further, as shown in FIG. 4d, a hole injection layer (HIL) 105 and a hole transport layer (HTL) 106 may be sequentially formed on each of the anodes 101; and an electron injection layer (EIL) 107 and an electron transport layer (ETL) 108 may be sequentially formed on each of the cathodes 102. The hole injection layers 105, the hole transport layers 106, the electron injection layers 107, and the electron transport layers 108 may be formed by any appropriate process. In one embodiment, a thermal evaporation process using a fine metal mask (FMM) may be used to form the hole injection layers 105, the hole transport layers 106, the electron injection layers 107, and the electron transport layers 108.

Specifically, in a high-vacuum evaporation chamber, the EILs 107 may be formed on the cathodes 102 firstly by a thermal evaporation process using an FMM. Then, The HILs 105 may be formed on the anodes 101 by a thermal evaporation process using an FMM. Then, the HTLs 106 may be formed on the HILs 105 by a thermal evaporation process using an FMM. Then, the ETLs 108 may be formed by a thermal evaporation process using an FMM. In certain other embodiments, the HILs 105 may be formed firstly.

The EILs 107 may be made of any appropriate material, such as alkali metal oxide including $Li_2O$, $LiBO_2$, $K_2SiO_3$ and $Cs_2CO_3$, alkali metal acetate, or alkali metal fluoride, etc. The HILs 105 may be made of any appropriate material, such as copper phthalocyanine, PEDT, PSS, or TNANA, etc. The HTLs 106 may be made of any appropriate material, such as NPB, or N, N'-dinaphthol-benzidine derivatives, etc. The ETLs 108 may be made of any appropriate material, such as luinoline derivatives, phenanthroline derivatives, silicon-containing heterocyclic compounds, quinoxaline derivatives, or perfluorinated oligomer, etc.

Figure 4E:
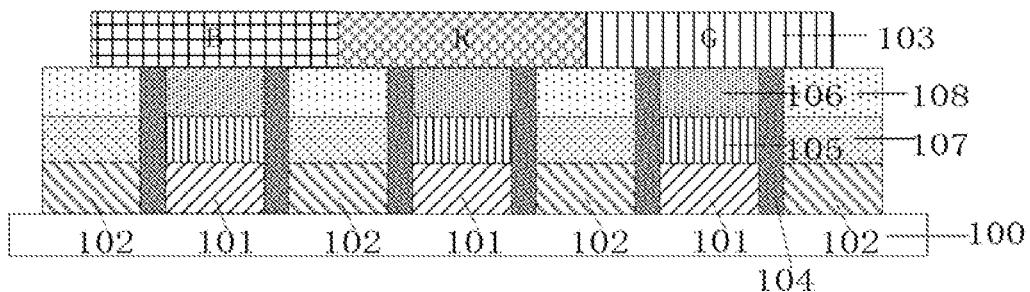

Returning to FIG. 3, after forming the plurality of anodes 101 and the plurality of cathodes 102, a light-emitting layer may be formed (S102). FIG. 4e illustrates a corresponding structure.

As shown in FIG. 4e, a light-emitting layer 103 is formed over the substrate 100 having the anodes 101 and the cathodes 102. Specifically, in one embodiment, the light-emitting layer 103 is formed on the HTLs 106, the ETLs 108, and the insulation layers 104.

The light-emitting layer 103 may include a plurality of light-emitting regions. In one embodiment, the light-emitting layer 103 may include a red light-emitting region (R), a green light-emitting region (G) and a blue light-emitting region (G). The three types of light-emitting regions may be fluorescent light-emitting regions and phosphor light-emitting regions. Other types of regions may also be included.

The phosphor material of the red light-emitting region (R) may include DCJTB derivatives, star-shaped DCM derivatives, or polycyclic aromatic hydrocarbons. The fluorescent material of the red light-emitting region (R) may include D/A framed none-doped red fluorescent material, etc. The fluorescent material of the green light-emitting region (G) may include quinacridone derivatives, coumarin derivatives, or polycyclic aromatic hydrocarbons, etc. The fluorescent material of the blue light-emitting region (B) may include diarylanthracene derivatives, diphenylethyllene aromatic derivatives, pyrene derivatives, spirobifluorene derivatives, TBP, DSA-Ph, or IDE-102, etc. The phosphor material of the blue light-emitting region (B) may be carbazol-containing main light-emitting material, or electron transporting main light-emitting material, etc. The doped phosphor materials for red light, green light, and blue light may include Pt complex, Ir complex, Eu complex, OS complex, or FlrPtic, etc.

Figure 4F:
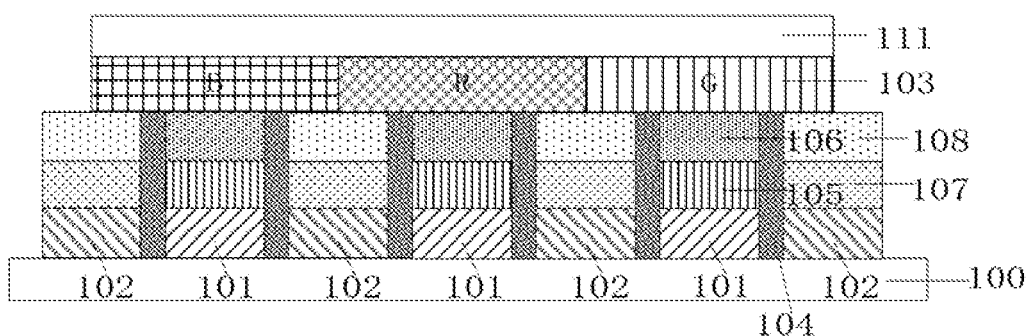

Further, as shown in FIG. 4f, after forming the light-emitting layer 3, a protective layer 111 may be formed over the light-emitting layer 3. The protective layer 111 may be made of any appropriate material; and may be formed by depositing a protective material layer using an open mask.

Further, according to the disclosed embodiments, a display panel is provided. The display panel comprises the disclosed top-emitting OLED substrate.

Further, according to the disclosed embodiments, a display apparatus is provided. The display apparatus may include at least one disclosed display panel.

Figure 5:
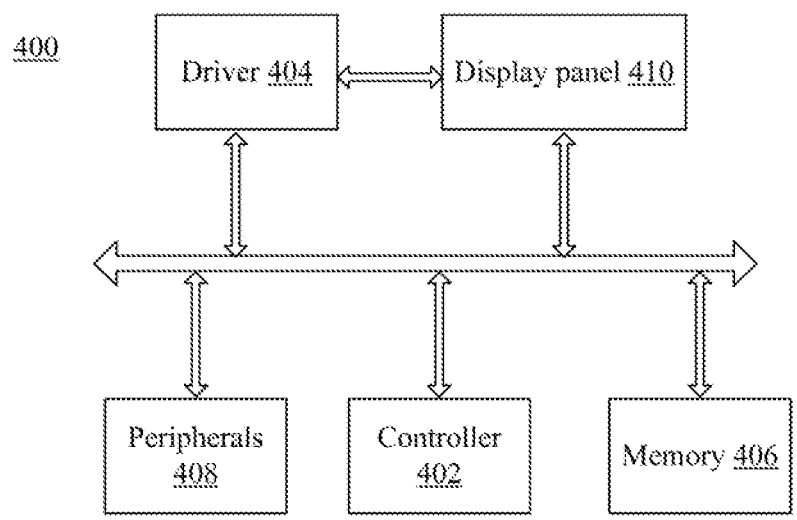
FIG. 5 illustrates a block diagram of an exemplary display apparatus according to the disclosed embodiments.

FIG. 5 illustrates the block diagram of an exemplary display apparatus 400 incorporating the disclosed display panel and other aspects of the present disclosure. The display apparatus 400 may be any appropriate device or component with certain display function, such as cell phones, tablets, TVs, monitors, laptop computers, digital cameras, or navigation systems, etc. As shown in FIG. 5, the display apparatus includes a controller 402, driver circuitry 404, memory 406, peripherals 408, and at least one disclosed display panel 410. Certain devices may be omitted and other devices may be included.

The controller 402 may include any appropriate processor or processors, such as a general-purpose microprocessor, digital signal processor, and/or graphic processor. The memory 406 may store computer programs for implementing various processes, when executed by the controller 402.

Peripherals 408 may include any interface devices for providing various signal interfaces. Peripherals 408 may also include any appropriate communication module for establishing connections through wired or wireless communication networks.

The driver circuitry 404 may include any appropriate driving circuits to drive the display panel 410. The display panel 410 may include one or more of the disclosed OLED substrate. During operation, the display panel 410 may be provided with image signals by the controller 402 and the driver circuitry 404 for display.

Because the anodes and the cathodes of the disclosed OLED substrate may be formed under the light-emitting layer, the layer number that the light emitted from the light-emitting layer transports through may be reduced. Thus, the luminous efficiency loss caused by the light wave-guide effect may be reduced; and the external quantum efficiency may be increased. Further, because the cathodes may not block the emitting light, the thickness limitation of the cathodes may be avoided. Further, because of the reflection of the anodes and the cathodes, the reflective ability of the OLED device may be enhanced. Therefore, the image quality and the display effect of the display apparatus having the disclosed top-emitting OLED display device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An organic light-emitting diode substrate, comprising:
   a substrate;
   a conductive layer formed over the substrate comprising a plurality of electrodes including a plurality of anodes and a plurality of cathodes, wherein each of the anodes is electrically insulated from the rest of the anodes and the cathodes; and
   a light-emitting layer including a plurality of light-emitting regions formed over the plurality of anodes and the plurality of cathodes, wherein at least one of the light-emitting regions is electrically connected with at least one of the anodes and at least one of the cathodes, and two adjacent ones of the light-emitting regions share one of the electrodes.

2. The organic light emitting diode substrate according to claim 1, further comprising:
   insulation layers between the anodes and adjacent cathodes for electrically insulating the cathodes from the adjacent anodes.

3. The organic light-emitting diode substrate according to claim 1, wherein the plurality of light-emitting regions emit different colors of light.

4. The organic light emitting diode substrate according to claim 1, wherein:
   the anodes are made of a reflective material;
   the anodes have a sandwich structure in an order of a first layer of a first material having a high work function, a second layer of a second material having a high reflectivity and a low resistivity, and a third layer of the first material.

5. The organic light emitting diode substrate according to claim 1, wherein:
the cathodes are made of a reflective material including one of an alloy having Mg and Ag, Li, K, an alloy having Ca and Ag, and Al.

6. The organic light-emitting diode substrate according to claim 1, further comprising:
a hole injection layer formed on each of the anodes and a hole transport layer formed on the hole injection layer between the anodes and the light-emitting layer.

7. The organic light-emitting diode substrate according to claim 6, further comprising:
an electron barrier layer between the hole transport layer and the light-emitting layer.

8. The organic light-emitting diode substrate according to claim 1, further comprising:
an electron injection layer formed on each of the cathodes and an electron transport layer formed on the electron injection layer between the cathodes and the light-emitting layer.

9. The organic light-emitting diode substrate according to claim 8, further comprising:
a hole barrier layer between the electron transport layer and the light-emitting layer.

10. The organic light emitting diode substrate according to claim 1, further comprising:
a protective layer over the light-emitting layer.

11. A display panel comprising the organic light emitting diode substrate according to claim 1.

12. A display apparatus comprising at least one display panel according to claim 11.

13. A method for fabricating an organic light-emitting diode substrate, comprising:
providing a substrate;
forming a conductive layer over the substrate comprising forming a plurality of electrodes including a plurality of anodes and a plurality of cathodes, wherein each of the anodes is electrically insulated from the rest of the anodes and the cathodes; and
forming a light-emitting layer including forming a plurality of light-emitting regions over the plurality of anodes and the plurality of cathodes, wherein at least one of the light-emitting region is electrically connected with at least one of the anodes and at least one of the cathodes, and two adjacent ones of the light-emitting regions share one of the electrodes.

14. The method according to claim 13, further comprising, between forming the plurality of anodes and forming the plurality of cathodes on the substrate:
forming a plurality of insulation layers for electrically insulating the plurality of cathodes from the plurality of anodes on the substrate.

15. The method according to claim 14, wherein:
the insulation layers are made of one of a black matrix material and polystyrene.

16. The method according to claim 13, further comprising:
forming a hole injection layer and a hole transport layer over each of the anodes after forming the plurality of anodes and the plurality of cathodes on the substrate; and
forming an electron injection layer and an electron transport layer over each of the cathodes after forming the plurality of anodes and the plurality of cathodes on the substrate.

17. The method according to claim 13, further comprising:
forming a protective layer over the light-emitting layer after forming the light-emitting layer.

18. The method according to claim 13, wherein:
the anodes and the cathodes are made of a reflective conductive material.

19. The method according to claim 13, wherein:
the anodes have a sandwich structure with an order of ITO, Ag and ITO; and
the cathodes are made of a reflective material including one of an alloy having Mg and Ag, Li, K, an alloy having Ca and Ag, and Al.

20. The method according to claim 13, wherein:
the cathodes are formed by one of a thermal evaporation process and a sputtering process.

* * * * *